United States Patent [19]

Sugimoto

[11] Patent Number: 4,633,179
[45] Date of Patent: Dec. 30, 1986

[54] MAGNETIC RESONANCE IMAGING APPARATUS USING SHIM COIL CORRECTION

[75] Inventor: Hiroshi Sugimoto, Tochigi, Japan

[73] Assignee: Kabushiki Kaisha Toshiba, Kawasaki, Japan

[21] Appl. No.: 712,183

[22] Filed: Mar. 15, 1985

[30] Foreign Application Priority Data

Mar. 15, 1984 [JP] Japan .................................. 59-50002

[51] Int. Cl.$^4$ ............................................. G01R 33/20
[52] U.S. Cl. ...................................... 324/309; 324/307
[58] Field of Search ............... 324/300, 307, 309, 311, 324/312, 313, 318, 319, 320, 322; 128/653

[56] References Cited

U.S. PATENT DOCUMENTS

| | | | |
|---|---|---|---|
| 4,254,778 | 3/1981 | Clow et al. | 128/653 |
| 4,319,190 | 3/1982 | Brown | 324/309 |
| 4,385,277 | 5/1983 | Hanley | 324/319 |
| 4,468,621 | 8/1984 | Hinshaw | 324/307 |
| 4,553,096 | 11/1985 | Randell | 324/309 |

*Primary Examiner*—Michael J. Tokar
*Attorney, Agent, or Firm*—Finnegan, Henderson, Farabow, Garrett & Dunner

[57] ABSTRACT

In an NMR imaging apparatus, the steady magnetic field is subjected to be deformed. The first shim coil pair is wound on a common bobbin and has a common diameter. The second shim coil pair is wound on the same bobbin and has the same diameter as that of the first shim coil pair. The first shim coil pair corrects homogeneity of the field components of the steady magnetic field having even-numbered higher order terms in the longitudinal axis of the object under examination. The second shim coil pair corrects uniformity of the magnetic field components of the steady magnetic field in the direction perpendicular to the longitudinal axis and also uniformity of the magnetic field components of the first coil pair in the direction perpendicular to the longitudinal axis.

7 Claims, 13 Drawing Figures

MAGNETIC RESONANCE IMAGING APPARATUS USING SHIM COIL CORRECTION

BACKGROUND OF THE INVENTION

I. Field of the Invention

The present invention relates to an imaging apparatus wherein a spin density distribution, relaxation time distribution and chemical shifts of a specified proton (generally, hydrogen nucleus) in biological tissue is measured externally from the object examined (i.e., a patient) in a non-invasive manner by utilizing a nuclear magnetic resonance (NMR) phenomenon so as to obtain information for medical diagnosis. More particularly, the present invention is directed to a magnetic resonance imaging apparatus capable of producing a highly uniform steady magnetic field.

II. Description of the Prior Art

Such an NMR imaging apparatus is described in, e.g., U.S. Pat. No. 4,254,778, issued on Mar. 10, 1981, to Clow et. al.

The known nuclear magnetic resonance techniques (referred to as "NMR" technicues) will be briefly described with reference to FIGS. 1 through 5.

Figure 1A:
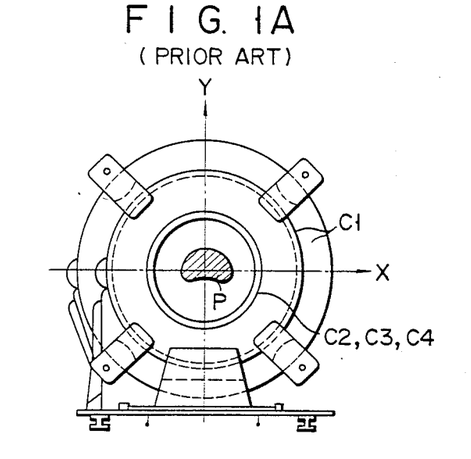
FIG. 1A shows a front view of an air coil employed in the conventional NMR apparatus.
Figure 1B:
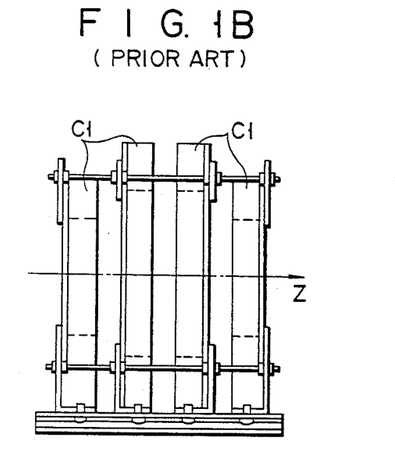
FIG. 1B shows a side view of the air coil shown in FIG. 1A.
Figure 2:
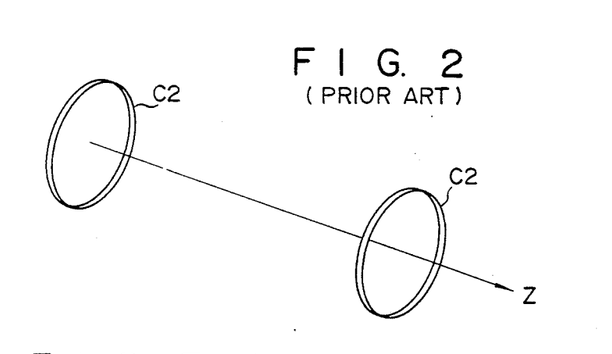
FIG. 2 shows the $G_z$ coil to be used in the MNR apparatus.
Figure 3:
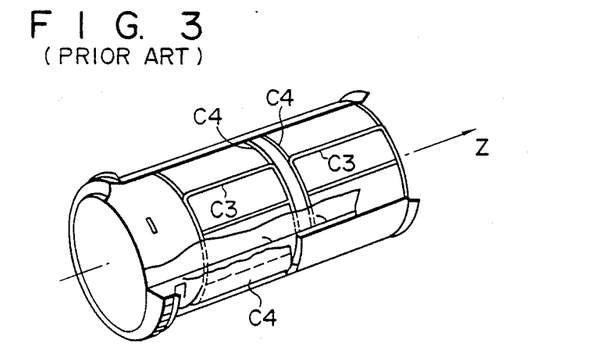
FIG. 3 shows typical $G_x$ and $G_y$ field coils in a practical MNR apparatus.
Figure 4:
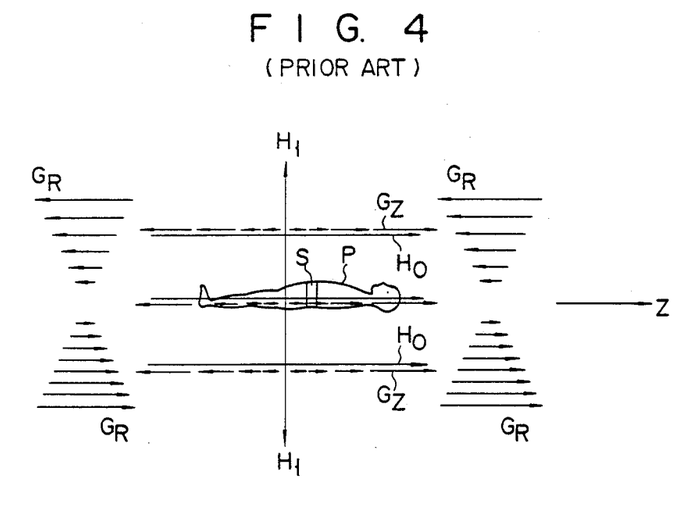
FIG. 4 shows the relationship of the $G_R$ field to other fields.

A steady magnetic field $H_o$ is generated by an air coil C1 shown in FIGS. 1A and 1B, and a magnetic gradient field is generated by gradient field generating coils C2, C3 and C4 (FIGS. 2 and 3) assembled together with the air coil Cl. FIG. 4 shows the fields diagrammatically illustrated in the side elevation in relation to a patient P. The steady field $H_o$ generated by the air coil C1 is superimposed in advance on a first gradient field $G_z$ generated by the coils C2. The gradient field $G_z$ can be obtained by flowing reverse currents through a pair of Helmholtz coils C2 shown in FIG. 2. This coil pair is called a "Maxwell pair". The gradient field $G_z$ has the same direction (z-axis) as that of the steady field $H_o$ and has a zero magnetic intensity on a central plane (perpendicular to the z-axis) between the pair of coils C2 so that the absolute values of the intensities of reverse field components linearly increase in opposite directions from the above-described central plane along the z-axis (FIG. 4). The patient P is then placed in the superimposed magnetic field. A selective exciting pulse $H_1$ having a proper frequency component is applied to the patient at a given time through a pair of saddle-shaped probe head coils C5. The selective exciting pulse $H_1$ has a center frequency of 4.258 MHz (corresponding to a magnetic field of 1,000 gausses for a hydrogen nucleus) of a carrier wave and is obtained by amplitude-modulating an RF pulse by a SINC function. When the selective exciting pulse $H_1$ is applied to the patient P, a nuclear magnetic resonance occurs in a plane region (a cross-sectional slice region with respect to the Z axis) wherein a frequency corresponding to a vector sum of the steady field $H_o$ and the gradient field $G_z$ becomes equal to the frequency of the selective exciting pulse $H_1$. Another magnetic gradient field $G_R$ obtained by a sum of vector components of second magnetic gradient fields $G_x$ and $G_y$ ($G_x$ and $G_y$ are perpendicular to each other and also to $G_z$) respectively generated by the gradient field generating coils C3 and C4 is applied to the slice S (i.e., chosen slice region) where a nuclear magnetic resonance occurs. In this condition, when a free induction decay signal (referred to as "FID signal") is measured through the probe head coil C5, this signal corresponds to a signal obtained by Fourier-transforming a projection signal indicating a specific nucleus density distribution in the direction of the gradient field GR within the slice S of the patient P. The direction of the gradient field $G_R$ can be varied within the x,y plane by changing the relative ratio of the intensity of the field $G_x$ generated by the coils C3 to that of the field $G_y$ generated by the coils C4. A resultant FID signal is subjected to the inverse Fourier transformation, thereby obtaining projection signals in various directions in the x,y plane. By utilizing these projection signals, an image indicating the density distribution signals, an image indicating the density distribution of the specific nucleus within the slice S of the patient P is obtained.

In general, the slice position of the object under examination such as a patient is very important for an occurrence of the NMR phenomenon. That is, the occurrence probability of the NMR phenomenon owns a significant relation to strengths of the magnetic fields given to the slice region of the object. The specified proton can only resonate with the applied magnetic fields within an extremely narrow field region. It is therefore necessary to generate the highly homogeneous magnetic field in the slice position so as to obtain medical information with better quality, e.g., the high spatial resolution.

Generally, in the diagnostic MNR imaging apparatus, the projection region, i.e., the diagnostic slice region must be less than 100 ppm ($10^{-4}$). The higher the uniformity of the magnetic field is, the better the spatial resolution becomes.

In this imaging apparatus, it is very difficult to precisely manufacture the sizes of the main coil (the air coil C1 in FIGS. 1A and 1B) for generating the steady magnetic field and also to precisely define the setting position thereof with respect to the other coils and accessaries. Accordingly, a desirable uniformity of the magnetic field may not be realized by only the main coil, so that the auxiliary coil, so-termed "shim coil" is additionally employed in conjunction with the mail coil. The major function of this slim coil is to correct the precision errors caused by the main coil and also the magnetic disturbances caused by the ferromagnetic materials, e.g., pillar's metals built in the diagnostic examination room, which are located around the main coil.

However, the following difficulty exists in the magnetic field correction by the conventional shim coil.

Figure 5:
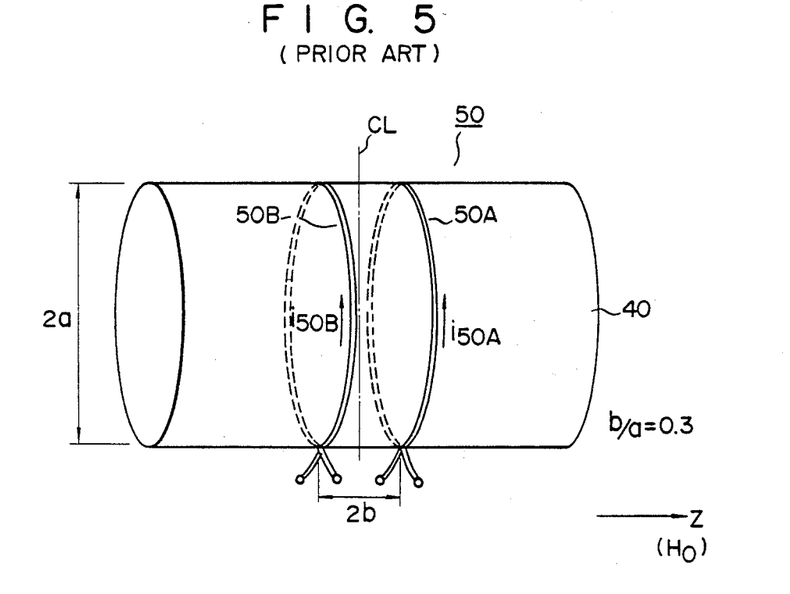
FIG. 5 schematically shows the conventional shim coil pair 50A, 50B wounded on the common bobbin 40.

FIG. 5 schematically shows the conventional shim coil assembly 50, as will be described in detail later, which is wounded on the same bobbin 40 as for the main coil and the gradient field coils. For clearity of illustration, the slim coil assembly 50 is solely shown. The shim coil assembly 50 is constructed by a pair of coil halves 50A and 50B. A radius of the coil halves 50A and 50B is indicated by "a", a diameter thereof being "2a". A distance between the respective coil halves 50A, 50B and a center line CL of the shim coil assembly 50 is denoted by "b", a distance between the opposite sides of the coil halves 50A and 50B being "2b". This shim coil assembly 50 is positioned along the Z axis that is parallel to the longitudinal axis of the object P and also to the direction of the steady magnetic field $H_o$, and perpendicular to the slice plane of the object P. Coil currents i50A and i50B flows through the respective coil halves 50A and 50B in the directions denoted by arrows. The following Taylor's-formular indicates the nonuniform steady magnetic field Bz in the Z direction, or axis:

$$Bz = A_1^0 + 2A_2^0Z + 3A_2^1X + 3B_2^1Y + 3A_3^0(2Z^2 - \quad (1)$$
$$Y^2)/2 + 12A_3^1ZX + 12B_3^1ZY + 15A_3^2(X^2 - Y^2) + 15B_3^2(2XY) +$$
$$A_4^0Z[8Z^2 - 15(X^2 + Y^2)]/2 + 15A_4^1X(4Z^2 - X^2 - Y^2)/2 +$$
$$15B_4^1Y(4Z^2 - X^2 - Y^2)/2 + 90A_4^2Z(X^2 - Y^2) + 90B_4^2Z(2XY) +$$
$$105A_4^3X(X^2 - 3Y^2) + 105B_4^3Y(3X^2 - Y^2) + \ldots$$

where $A_i^j$, $B_i^j$ (i, j=0, 1, 2 ... n) is a constant determined by the magnetic field distribution, and X, Y, Z indicates orthogonal coordinates. For the simplicity, the fourth order's term and the succeeding order's terms are omitted.

If a distance measured from an origin in the X - Y coordinate plane is denoted by "R", the following relation can be understood $$R^2 = X^2 + Y^2 \quad (2)$$

Then the above Taylor's formula (1) can be substituted by the following formula;

$$Bz = A_1^0 + 2A_2^0Z + 3A_2^1X + 3B_2^1Y + 3A_3^0(2Z^2 - R^2)/2 + \quad (3)$$
$$12A_3^1ZX + 12B_3^1ZY + 15A_3^2(X^2 - Y^2) + 15B_3^2(2XY) +$$
$$A_4^0Z(8Z^2 - 15R^2)/2 + 15A_4^1X(4Z^2 - R^2)/2 +$$
$$15B_4^1Y(4Z^2 - R^2)/2 + 90A_4^2Z(X^2 - Y^2) + 90B_4^2Z(2XY) +$$
$$105A_4^3X(X^2 - 3Y^2) + 105B_4^3Y(3X^2 - Y^2) + \ldots$$

In general, the magnetic field correction by the shim coil, i.e., so-called "shimming", implies the following operation.

In the modified Taylor's formula (3), a plurality of shim coils is provided, each of which generates the specific correction field component for each of the terms (e.g., $3A_2'X$, $A_4°Z(8Z^2-15R^2)/2$) with exception of the constant term, i.e., $A_1°$, so that the respective terms can be cancelled by the corresponding shim coils. As a result, it can reduce the field strength variations due to the coil's location in the coordinates. Consequently the main coil can generate highly homogeneous steady magnetic field $H_o$ in conjunction with the shimming coils.

Figure 6:
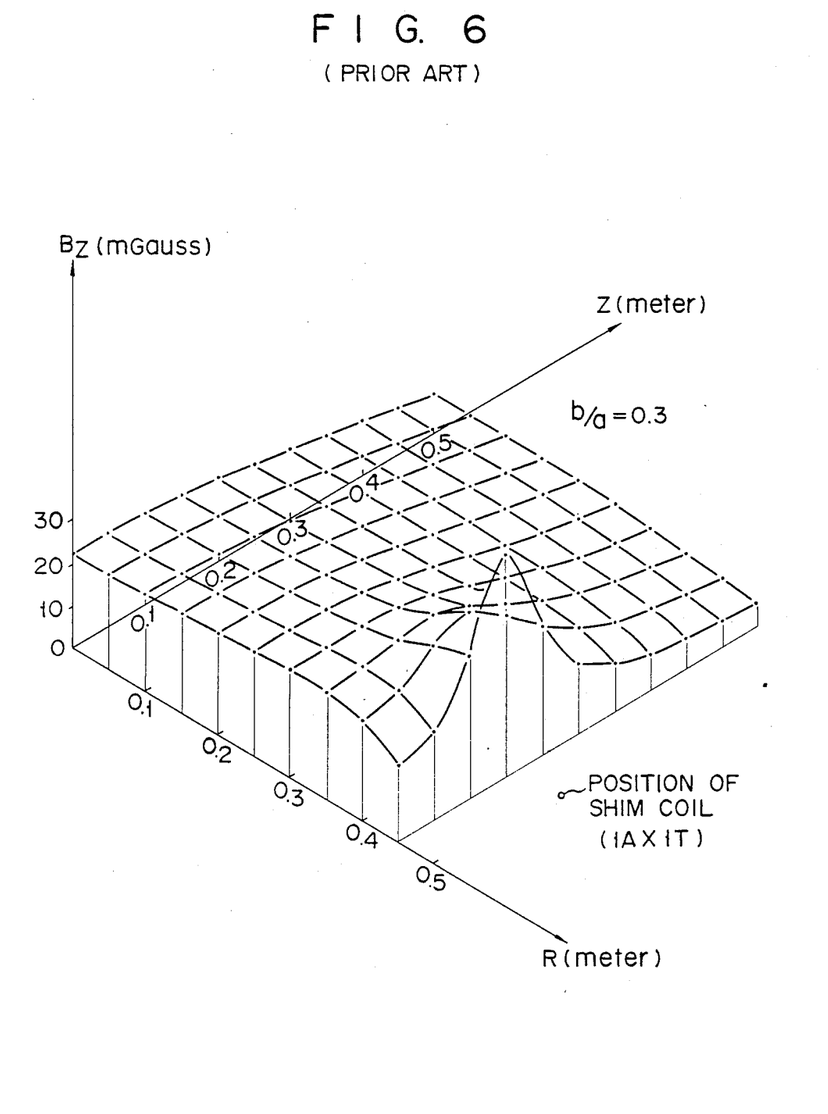
FIG. 6 is an illustration of the shim correction magnetic field by the shim coil pair of FIG. 5.

On the other hand, if attention is given to the Z direction and the radial direction perpendicular thereto in case of the magnetic field correction by the shim coil, the following problem occurs. When the magnetic field correction for the second order term in the Z direction (axis), the magnetic field in the radial direction is adversely influenced. For instance, if the second order term $Z^2$ is considered and the following coil data is applied to the shim coil assembly 50 shown in FIG. 5, then the magnetic field distribution is represented in FIG. 6. The respective coil halves 50A and 50B has one turn and the coil current is one ampere. The magnetic density Bz is milli-gauss in unit, and the R and Z axes are plotted in meter. The ratio of the distance "2b" to the coil radius "a" is 0.30 (b/a=0.30).

Under these conditions, the magnetic field correction is performed by the shim coil 50 with respect to the second order term, i.e., $3A_2°(2Z^2-R^2)/2$ of the formula (3). However, the field distribution in the radial direction is subjected to be distorted. That is to say, as can be seen from the Taylor's formula (3), the magnetic field in the radial (R) direction is substantially uniform, but that in the Z direction is not so homogeneous. If the above-described magnetic field correction by the shim coil 50 is carried out, the magnetic field in the radial direction which has been uniform is necessarily distorted.

Furthermore, due to precision errors in manufacturing the main coil and the shim coil and the magnetic field disturbance by the ferromagnetic materials, the uniformity of the magnetic field in the radial direction cannot be corrected, resulting in the poor quality of the diagnostic images.

An object of the present invention is to provide a magnetic resonance imaging apparatus where highly homogeneous steady magnetic fields can be produced so as to obtain useful medical information by utilizing the nuclear magnetic resonance phenomenon.

SUMMARY OF THE INVENTION

These objects may be accomplished by providing a magnetic resonance imaging apparatus for examining an object having a longitudinal axis and a cross-sectional slice perpendicular thereto, by nuclear magnetic resonance, comprising:

a magnetic coil for applying to said object a steady magnetic field along said longitudinal axis;

a first coil, which is arranged along said longitudinal axis, for applying to said object a first gradient field, which in conjunction with said steady field provides a predetermined field in said cross-sectional slice of said object, the field direction of said first gradient field being parallel to that of said steady magnetic field and the absolute value of the field strength value of the field strength of said first gradient field increasing linearly in opposite directions from said cross-sectional slice along said longitudinal axis;

a probe head coil for applying RF pulses to said cross-sectional slice in a direction perpendicular to said longitudinal axis so as to excite nuclei therein which are being subjected to said predetermined field, and for detecting nuclear magnetic resonance signals derived from said cross-sectional slice;

a second coil for applying a second gradient field to said cross-sectional slice so as to define a projection angle of said nuclear magnetic resonance signals, the field direction of said second gradient field being perpendicular to said steady magnetic field and the strength of said second gradient field varying linearly, orthogonal to said first gradient field;

a signal processing unit for receiving said nuclear magnetic resonance signals from said probe head coil, and for processing said received nuclear magnetic resonance signals by use of a two-dimensional Fourier transformation to produce an image of said cross-sectional slice; and, a correction coil assembly having at least first and second coil pairs, said first coil pair generating in conjunction with said steady magnetic field a first correction magnetic field so as to correct homogeneity of magnetic field components of said steady magnetic field having even-numbered higher order terms in said longitudinal axis, and said second coil pair generating in conjunction with said steady magnetic field a second correction magnetic field so as to correct uniformity of magnetic field components of said steady magnetic field in a direction perpendicular to said longitudinal axis, and also uniformity of magnetic field components of said first coil pair in said direction perpendicular to said longitudinal axis.

BRIEF DESCRIPTION OF THE DRAWINGS

These and other objects and features of the invention will become apparent with reference to the following specification and to the drawings wherein.

DETAILED DESCRIPTION OF THE PREFERRED EMBODIMENTS

Before proceeding with various embodiments according to the present invention, the basic operation thereof will now be described.

Referring back to Taylor's equation (3), it can be understood that if a number of shim coil assemblies and of corresponding DC sources were employed, the magnetic field correction could be perfectly achieved. However, in view of economical reasons, the number of both the shim coil assemblies and the respective DC sources has to be reduced as small as possible. As the coefficients belonging to the lower order's terms of the equation (3) are so large, it is normally preferable to produce the correction fields by the shim coil assemblies so as to cancel the magnetic fields of the lower order's terms.

With respect to the coefficients in Taylor's equation (3), the following data is obtained;

Up to the first order term; Three components of X,Y, and Z.

Up to the second order term; Eight components, in total, of X, Y, Z, $(2Z^2-R^2)$, ZX, ZY′, $(X^2-Y^2)$ and 2XY.

Up to the third order term; Fifteen components in total (see equation (3)).

It is understood from the foregoing that if the higher order terms are cancelled by employing the proper shim coil assemblies, a large number of the shim coil assemblies and of the corresponding DC sources are necessarily required. However, as already mentioned before, such a shim magnetic field correction is not preferable due to the economical reason and the construction design.

When an attention is given to the second order term and the third order terms in Taylor's equation (3) which are not cancelled by the conventional shim coil, the following terms containing a pair of coefficients of $Z^2$ and $R^2$ are listed up;

TABLE 1

| | |
|---|---|
| $3A_3{}^0(2Z^2 - R^2)/2$ | second order term; |
| $A_4{}^0(8Z^2 - 15R^2)/2$ | |
| $15A_4{}^1X(4Z^2 - R^2)/2$ | third order term |
| $15B_4{}^1Y(4Z^2 - R^2)/2$ | |

From the above list, the ratio of $Z^2$ to $R^2$ is different from each other.

The feature of the present invention will now be summarized.

Only first and second shim coil pairs are positioned under a given condition in combination with the main coil. This condition involves a distance between the coil halves of the respective coil pairs, and also the ratio of the coil radius to the coil distance. The first shim coil pair generates a predetermined correction field for canceling the terms up to the second orders with exception of the term $(2Z^2-R^2)$ as listed up in Table 1. In other words, the first shim coil pair can correct the homogeneity of the magnetic field components of the steady magnetic field ($H_o$) having even-numbered higher order terms along the Z axis (i.e., the longitudinal direction perpendicular to the cross-sectional slice of the object).

The second shim coil pair generates another correction field for canceling the terms of the equation (3) having more than third higher orders of the pairs of ($Z^2$, $R^2$) That is to say, this second shim coil pair can correct the uniformity of the magnetic field components of the steady magnetic field in the R direction (i.e., the radial direction normal to the Z axis) as well as the uniformity of the magnetic field components of the first shim coil pair in the R direction.

As a result, both the first and second shim coil pairs can correct the homogeneity of the steady magnetic field both in the R and Z axis by positioning the shim coil pairs to a given position and flowing a given current therein.

Figure 7:
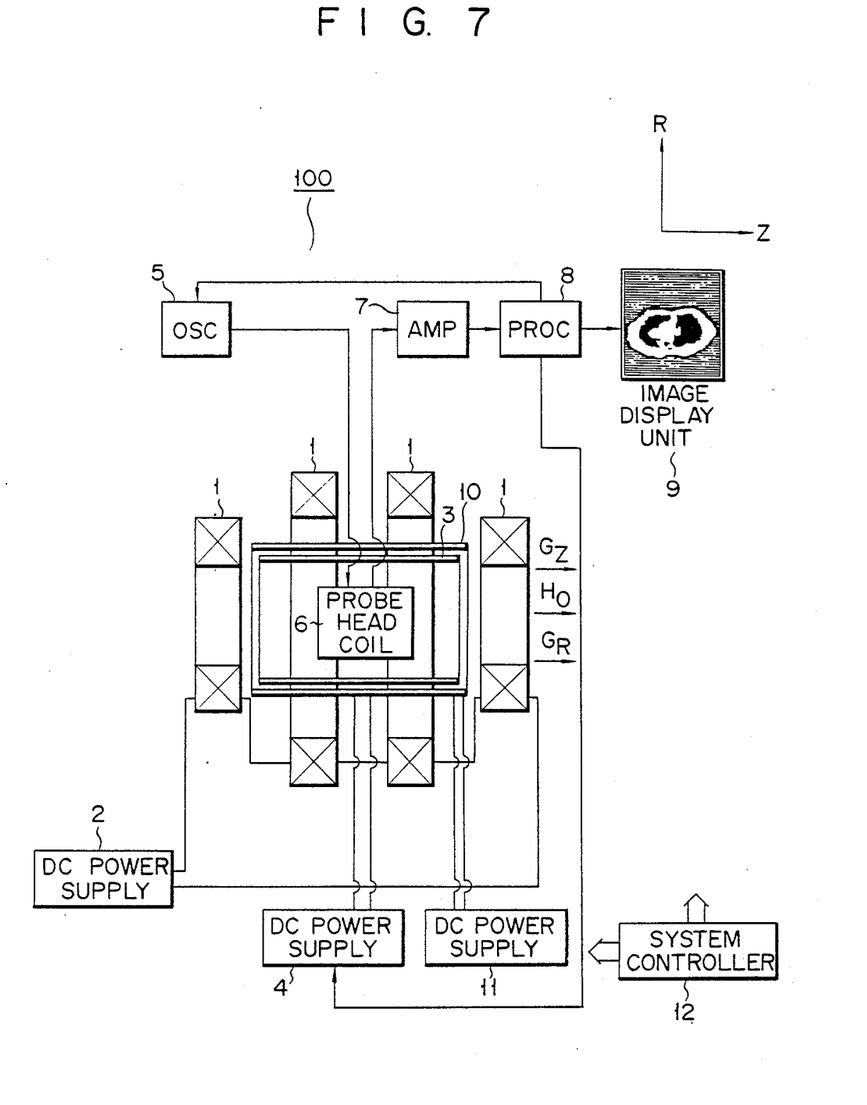
FIG. 7, schematically shows a block diagram of the magnetic resonance imaging apparatus according to one preferred embodiment.

Referring to FIG. 7, a description will now be made of a magnetic resonance imaging apparatus 100 according to the invention.

A main coil assembly 1 (simply referred to as "main coil") is provided to surround an object under examination (not shown in detail) such as the patient P shown in FIG. 4. In general, the main coil 1 is made of an air coil. A DC power supply 2 is connected to the main coill so as to generate the steady magnetic field ($H_o$) as a first magnetic field. The strength of the steady magnetic field $H_o$ is strong enough to orientate the macroscopic magnetization in the specific direction, which is constructed by a combination of the nuclear magnetic moments of the specific nuclei within the object. As seen from FIG. 7, the field direction of the steady magnetic field $H_o$ is parallel to the Z axis (the longitudinal axis of the patient P) and also perpendicular to the slice S of the patient P.

Another coil assembly 3 is provided to generate the first gradient field and to selectively generate the second gradient fields. This gradient coil assembly 3 (simply referred to as "gradient coil") is energized by another DC power supply 4. The first gradient field $G_z$ is used to determine the slice position within the patient P, while the second gradient fields ($G_x$, $G_y$) are used to determine the projection direction of the MNR (nuclear magnetic resonance) signals such as the FID signals. The direction of the first gradient field $G_z$ is parallel to the steady magnetic field $H_o$, i.e., orthogonal to the slice S of the patient P. The directions of the second gradient fields ($G_x$, $G_y$) are perpendicular to each other and also orthogonal to the first gradient field $G_z$. However, FIGS. 4 and 7 show only the direction of the gradient field $G_R$ synthesized by both the gradient fields ($G_x$, $G_y$). The direction of the synthesized gradient field $G_R$ is parallel to the first gradient field $G_z$ and to the steady magnetic field $H_o$. The gradient coil 3 is, for instance, made of the Helmholtz pair, or the saddle coil pair.

As previously described, the absolute value of the field strength of the first or second gradient field ($G_z$, $G_R$) increases linearly in opposite directions from the cross-sectional slice S along the longitudinal axis Z.

An oscillator 5 is provided to generate RF (radio frequency) pulses. The RF pulses are supplied to a probe head coil 6, which constitutes a single transmitter-receiver coil. From the single probe head coil 6, the appropriate electromagnetic energy as the rotation field is applied as a 180° pulse or a 90° pulse, and also the NMR signals are received. As the rotation field of the probe head coil 6 gives an influence to the magnetic field superimposed by the steady magnetic field $H_o$ and the first linear gradient field $G_z$, only the specific nuclei, e.g., proton within the slice P determined by this synthesized magnetic field can be selectively excited under the application of the RF pulses having the frequency of 42.6 MHz at 10.7 killo gausses.

The FID (free induction decay) signals of the MNR signals are received by the same probe head coil 6 and fed via amplifier 7 to a signal processor 8. The signal processor 8 processes the amplified FID signals with respect to a plurality of projection directions corresponding to a plurality of second gradient fields so as to reconstruct a tomographic image containing such medical information as the spin density distribution, and the relaxation time distribution with respect to the slice S in the same directions as the above projection directions. The resultant tomographic image is monitored on an image display unit 9.

Figure 8:
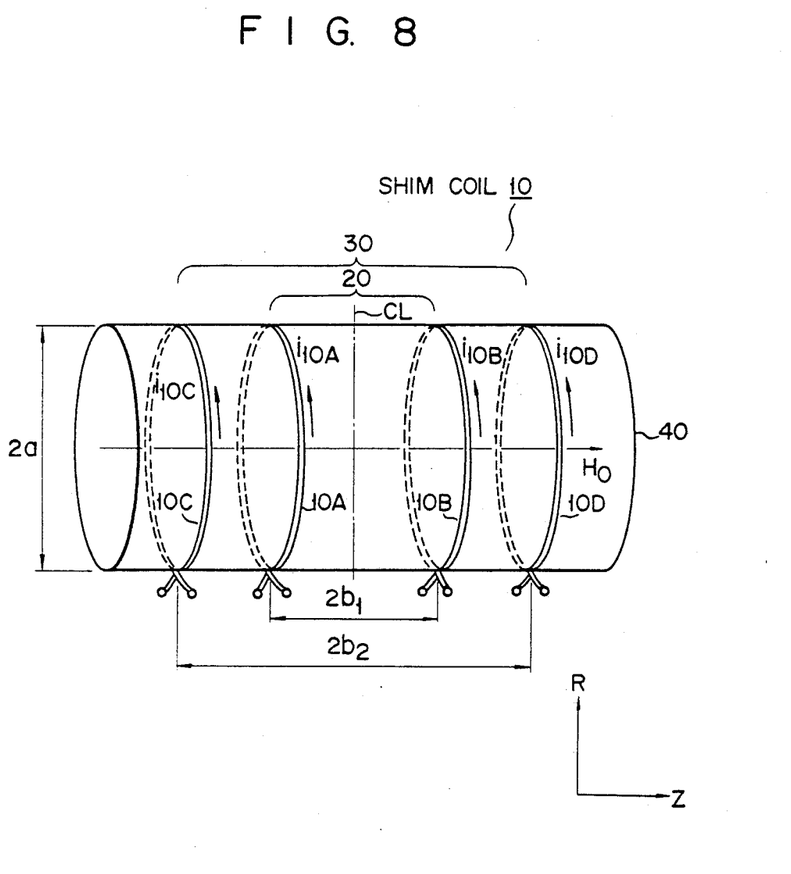
FIG. 8 schematically shows the first shim coil assembly used in the apparatus shown in FIG. 7.

In addition to the main coil 1 and the linear gradient coil 3, a shim coil assembly (simply referred to as "shim coil") 10 is provided on the linear gradient coil 3. Referring to FIG. 8, a detailed description of the shim coil 10 will now be made.

For an easy understanding, each of shim coils 10A to 10D has one coil turn. A first shim coil pair 20 is wound on the common bobbin 40. The diameter of both coil pairs is "2a" and the distance between the respective coil halves 10A and 10B is "2b1". Accordingly, the first shim coil pair 20 consisting of the coil halves 10A and 10B has the relationship of $b_1/a=0.3$. The correction magnetic field by this first shim coil pair 20 corresponds to the conventional correction field as shown in FIG. 6.

A second shim coil pair 30 is also wound on the same bobbin 40. The positional relationship of the second shim coil 30 with the center line CL, i.e., the first shim coil pair 20 is selected to be $b_2/a=0.62$.

Both the first and second shim coil pairs 20 and 30 are connected to a DC power supply 11. A system controller 12 is connected to all of the circuit elements so as to perform the NMR imaging in a predetermined control sequence.

Figure 9:
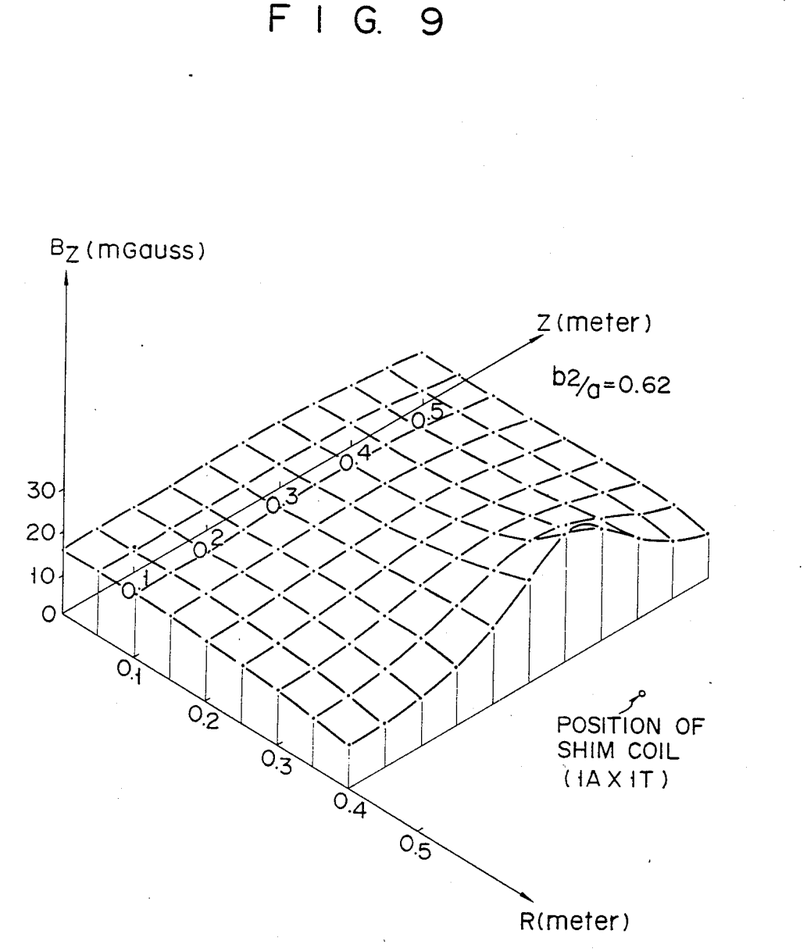
FIG. 9 is an illustration of the shim correction magnetic field by the shim coil assembly of FIG. 8.

The shimming operations according to the first embodiment will now be described with reference to FIGS. 6, 8 and 9.

The first shim coil pair 20 has the relationship of $b_1/a =0.3$ and the coil currents i10A and i10B are set to be equally 1 ampere respectively, whose flow directions are identical to each other (see FIG. 8). The field distribution by this first shim coil pair 20 is represented in FIG. 6, which has been already described as the prior art. By introducing this first shimming operation, or the first field correction, all order terms of Taylor's equation (3) except more than third order terms and the second term having the coefficient ($2Z^2 - R^2$) can be cancelled. Accordingly, the first shimming operation is accomplished by the first shim coil pair 20.

The second shim coil pair 30 has the relationship of $b_2/a =0.62$ and the coil currents i10C and i10D are selected to be equally 1 ampere respectively. Similarly, the flow directions of both coil currents are identical to each other (see FIG. 8). A magnetic field generated by the second shim coil pair 30 has a distribution as shown in FIG. 9.

A detailed description will now be made of the features of the present invention by employing the above-described shim coil arrangement.

First, it can be apparent that due to economical reasons, the number of the shim coils for the correction of the steady magnetic field must be small as possible as being designed as attention is given to equation 3 and Table 1. Also it can be understood that since the coefficients of the lower order terms are greater than those of the higher order terms, the effective shimming can be realized by canceling successively the lower order terms, as compared with the shimming for the higher order terms.

In accordance with the present invention, a combination is effected for the first shim coil pair and the second shim coil pair. The first shim coil pair corresponding to the conventional shim coil pair can generate the first correction magnetic field in conjunction with the steady magnetic field $H_o$ so as to correct the uniformity of the magnetic field components of said steady magnetic field having even-numbered higher order terms with exception of the term "$3A_3°(2Z^2-R^2)/2$" in the Z direction.

The second shim coil pair newly employed can generate the second correction magnetic field in conjunction with the steady magnetic field so as to correct the homogeneity of the magnetic field components of the steady magnetic field in the R direction as well as the uniformity of the magnetic field components of the first shim coil pair in the R direction. In other words, the correction field by the second shim coil pair, e.g., the coil pair 30 in FIG. 8 can cancel more than third terms containing a pair of ($Z^2$, $R^2$) and the field distortion caused by the first shim coil pair, e.g., the coil pair 20 in FIG. 8.

As to the second order term ($3A_3°(2Z^2-R^2)/2$), the second shim coil pair having a different ratio of $R^2$ to $Z^2$ is introduced in addition to the conventional first shim coil pair, thereby ensuring the highly uniform steady magnetic field $H_o$.

It should be noted that the coil positions, diameters, and coil currents are determined by the specific values according to the recognition of the invention.

For instance, observing the field pattern for the first shim coil pair 20 (coil ratio $b_1/a=0.3$) shown in FIG. 6, the following ratio of the magnetic field strength may be calculated when the field strengths at the distances from the origin (Z, R=0.25 meter) are compared with those at the origin (i.e., 20 milli-gauss):

$$Z^2:R^2 = 5:-3 \quad (4)$$

As previously described, this first shim coil pair 20 corresponds to the conventional one for canceling the even-numbered higher order terms in the equation (3) with exception of the term $(3A_3°(2Z^2-R^2)/2)$. In other words, this first shim coil pair cannot correct the field components having the coefficient $(Z^2, R^2)$, i.e., the radial direction, resulting in a nonuniform steady magnetic field.

According to the invention, a further shim coil pair, i.e., the second shim coil pair is employed in addition to the above-mentioned first shim coil pair. This second shim coil pair is denoted in FIG. 8 by the second shim coil pair 30, whose field pattern is shown in FIG. 9. Similarly in FIG. 9, when the comparison is made between the field strengths at the positions from the origin (Z, R=0.25 meter) and those of the origin (approximately 15 milli-gauss), the ratio of $$Z^2:R^2 = -1:3 \quad (5)$$

is obtained.

Then, these shimming magnetic fields by the first shim coil pairs 20 and 30 are superposed on each other;

$$(-Z^2+3R^2)+k(5Z^2-3R^2) = (-1+5k)Z^2+(3-3k)R^2$$

Namely, $$Z^2:R^2 = (-1+5k):(3-3k) \quad (6)$$

From the formula (6), it is obvious that a certain ratio may be obtained by properly changing the value of "k".

The value of "k" is determined by the coil currents flowing through the respective coil halves and the turn numbers thereof. For example, according to the first embodiment as shown in FIGS. 8 and 9, the coil currents i10A to i10D are selected to be 1 ampere respectively and the turn numbers of the coil halves 10A to 10D are selected to be 1 turn respectively.

A second embodiment will now be described with reference to FIG. 10.

Figure 10:
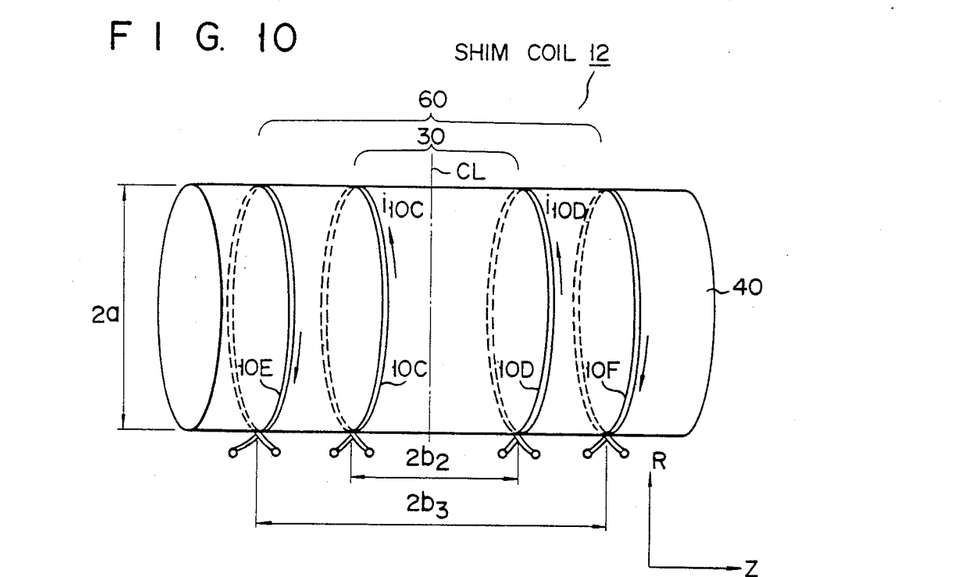
FIG. 10 schematically shows the second shim coil assembly used in the apparatus shown in FIG. 7.

In FIG. 10, a shim coil assembly 12 according to the second embodiment is constructed by a first shim coil pair 30 and a second shim coil pair 60. The first shim coil pair 30 is constructed by coil halves 10C and 10D, and the second shim coil pair 60 is constructed by coil halves 10E and 10F.

The first shim coil pair 30 is identical to the second shim coil pair of the first embodiment. The ratio of the distance $2b_2$ to the diameter $2a$ for the coil halves 10C and 10D of the first shim coil pair 30 is therefore $b_2/a=0.62$. The currents flowing through these coil halves 10C and 10D are 1 ampere respectively.

The ratio of the coil distance $2b_3$ to the diameter between two coil halves 10E and 10F is selected to be $b_3/a=1.18$. The coil currents flowing through the respective coil halves 10E and 10F are $-1$ ampere respectively. The numbers of the wound coil halves are 3 amperes respectively.

It can be understood that in this embodiment, the first shim coil pair 30 is newly employed according to the invention and the second shim coil pair 60 is the conventional coil pair.

Figure 11:
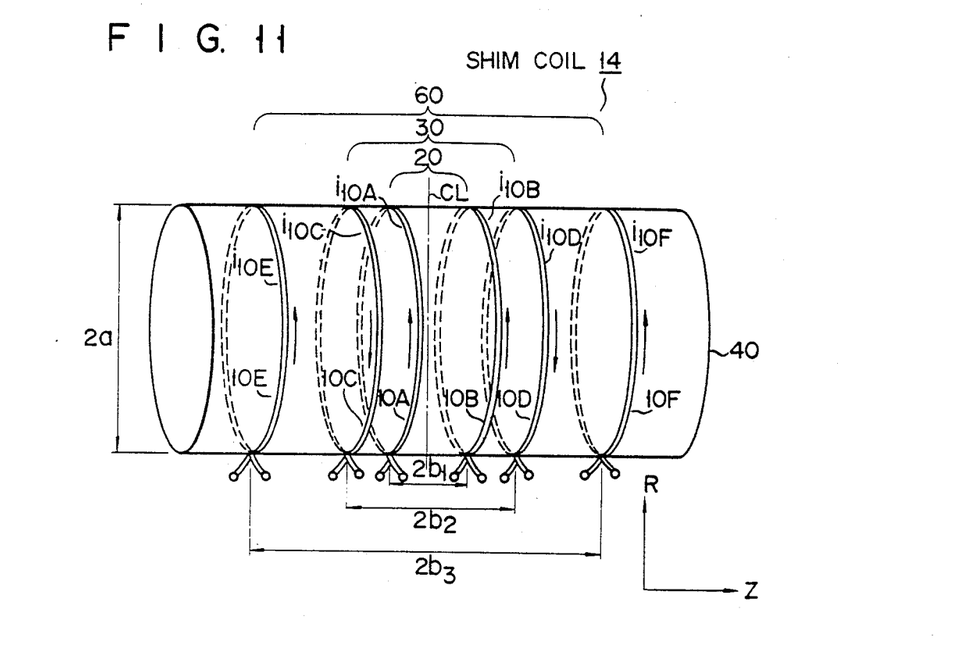
FIG. 11 schematically shows the third shim coil assembly used in the apparatus shown in FIG. 7.
Figure 12:
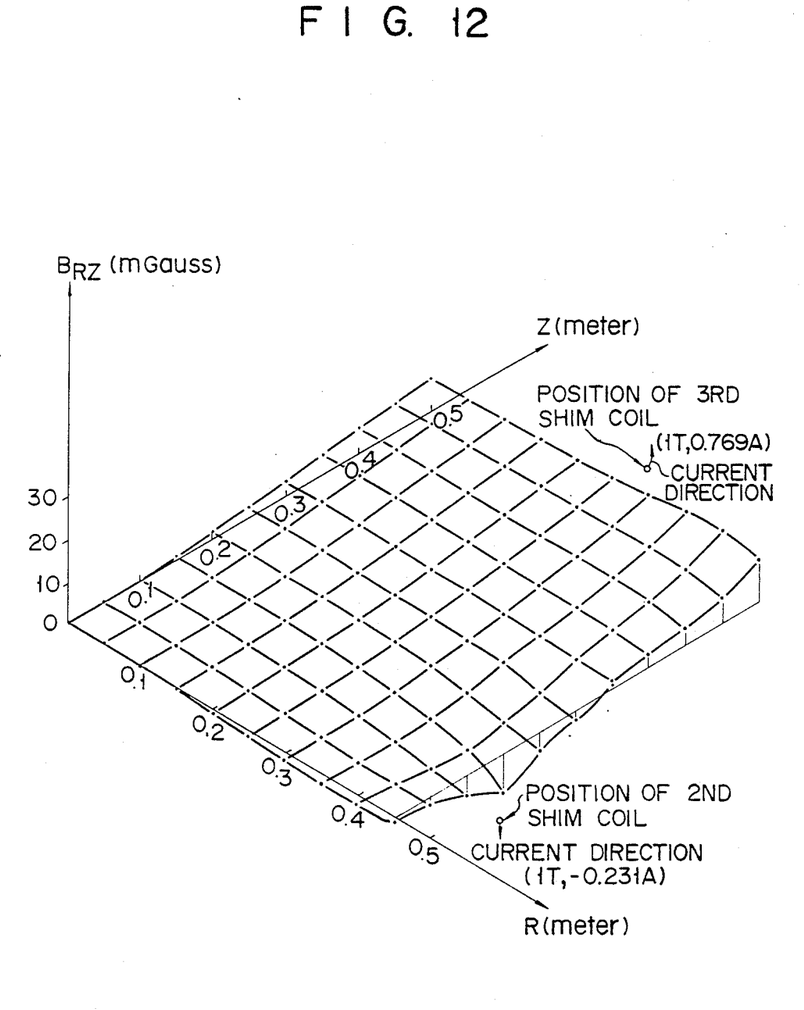
FIG. 12 is an illustration of the shim correction magnetic field partially generated by the third shim coil assembly of FIG. 11.

Referring to FIGS. 11 and 12, a description of a third embodiment will now be made.

For simplicity and illustration, the size and distances between the respective coil halves do not correspond to those of the previous embodiments as shown in FIGS. 8 and 10.

A coil arrangement of a shim coil assembly 14 according to the third embodiment is shown in FIG. 11. The shim coil assembly 14 is constructed by a first shim coil pair 20, a second shim coil pair 30, and a third shim coil pair 60 in this order from the center line CL. Since each of these coil pairs 20, 30 and 60 is previously described in the foregoing embodiments, the same reference numerals are utilized in this embodiment. Although it is not shown in detail, these coil pairs are connected to the DC power supply 11 so as to allow a given current to be flowed through each of the coil halves 10A to 10F.

The coil currents of these coil halves are as follows.

The coil currents i10A=i10B of the first shim coil pair 20 are 1 ampere respectively, the turn numbers of the coil halves 10A and 10B being equally 1.

As to the second shim coil pair 30, the coil currents i10C, i10B are selected to be $-0.231$ ampere respectively. The negative sign of $-0.231$ A implies that the flow directions of these currents i10C, i10D are opposite to those of the coil currents i10A, i10B. The numbers of the coil halves 10C and 10D are equal to 1.

The third shim coil pair 60 has the coil currents i10E and i10F of 0.769 ampere and the numbers of the wounded coil halves 10E and 10F of 1 respectively.

A combined field pattern of the second and third shim coil pairs 30 and 60 is illustrated in FIG. 12 while the field pattern of the first shim coil pair 20 is shown in FIG. 6.

As previously described in detail, a combined field pattern of the first, second and third coil pairs 20, 30 and 60 is superimposed with the steady magnetic field $H_o$ so that the highly homogeneous steady magnetic field can be realized.

It should be noted that the shim coil pair having the ratio of $b/a=0.62$ is newly employed in the respective embodiments, whereby the magnetic field components of the steady magnetic field in the R (radial) direction and also those of the remaining coil pair in the R (radial) direction can be corrected for the uniformity of the steady magnetic field.

As previously described with reference to the specific embodiments, the advantage of the present invention is that the highly homogeneous steady magnetic field can be easily obtained by simply employing a few numbers of the shim coil pairs and the corresponding DC power supplies. Since the NMR imaging apparatus having such a simple correction coil arrangement according to the invention can be realized, the uniform steady magnetic field can be produced without a high manufacturing cost.

Specifically, only the shimming correction field for the second order terms of the equation of the steady magnetic field strength Bz is simply superimposed to the originally-generated steady magnetic field $H_o$, with the result that it can be obtained for the same correction effect as the shimming correction field for the even-numbered higher order terms such as the fourth and sixth order terms of the equation 1.

While the present invention has been described using a specific embodiment, it should be understood that further modifications and changes can be made without departing from the scope of the present invention.

For instance, the main coil assembly and the gradient field coil assembly may be made of superconducting materials.

It is also possible to increase the turn number of the shim coil assembly, while the current flowing through the coil assembly is reduced, resulting in the ecomonical merit.

What is claimed is:

1. An imaging apparatus for examining an object having a longitudinal axis and a cross-sectional slice perpendicular thereto, by nuclear magnetic resonance, comprising:

magnetic means for applying to said object a steady magnetic field along said longitudinal axis;

first coil means, which is arranged along said longitudinal axis, for applying to said object a first gradient field, which in conjunction with said steady magnetic field provides a predetermined field in said cross-sectional slice of said object, the field direction of said first gradient field being parallel to that of said steady magnetic field and the absolute value of the field strength value of said first gradient field increasing linearly in opposite directions from said cross-sectional slice along said longitudinal axis;

probe head coil means for applying RF pulses to said cross-sectional slice in a direction perpendicular to said longitudinal axis so as to excite nuclei therein which are being subjected to said predetermined field, and for detecting nuclear magnetic resonance signals derived from said cross-sectional slice;

second coil means for applying a second gradient field to said cross-sectional slice so as to define a projection angle of said nuclear magnetic resonance signals, the field direction of said second gradient field being perpendicular to said steady magnetic field and the strength of said second gradient field varying linearly, orthogonal to said first gradient field;

signal processing means for receiving said nuclear magnetic resonance signals from said probe head means, and for processing said received nuclear magnetic resonance signals by use of a two-dimensional Fourier transformation to produce an image of said cross-sectional slice; and, correction coil means having at least first and second coil pairs, said first coil pair generating in conjunction with said steady magnetic field a first correction magnetic field so as to correct homogeneity of magnetic field components of said steady magnetic field having even-numbered higher order terms in said longitudinal axis, and said second coil pair generating in conjunction with said steady magnetic field a second correction magnetic field so as to correct uniformity of magnetic field components of said steady magnetic field in a direction perpendicular to said longitudinal axis, and also uniformity of magnetic field components of said first coil pair in said direction perpendicular to said longitudinal axis.

2. An apparatus as claimed in claim 1, wherein said even-numbered higher order terms are selected to be two order terms.

3. An apparatus as claimed in claim 1, wherein each of said first and second coil pairs has first and second coil halves having a common diameter, and a given ratio (b/a) of a distance "2b" to said common diameter "2a", said distance being measured between the respective first and second coil halves.

4. An apparatus as claimed in claim 3, wherein said ratio (b1/a) of said first coil pair is set to be 0.30 and said ratio (b2/a) of said second coil pair is set to be 0.62, while first and second currents flowing through said first and second coil pairs are 1 ampere respectively and the turn numbers thereof are commonly selected to be 1.

5. An apparatus as claimed in claim 3, wherein said ratio (b3/a) of said first coil pair is selected to be 1.18 and said ratio (b2/a) of said second coil pair is selected to be 0.62, while first current of said first coil pair is −0.231 ampere, second current of said second coil pair is 1 ampere, respectively and the turn numbers thereof are commonly selected to be 1.

6. An apparatus as claimed in claim 3, further comprising a third coil pair having first and second coil halves and a given ratio (b3/a) of a third distance "2b3" to a third diameter "a3", said third distance being measured between said respective coil halves.

7. An apparatus as claimed in claim 6, wherein said ratio (b1/a) of said first coil pair is selected to be 0.30, said ratio (b2/a) of said second coil pair is set to be 0.62, and said ratio (b3/a) of said third coil pair is chosen to be 1.18, while first current of said first coil pair is 1 ampere, second current of said second coil pair is −0.231 ampere, third current of said third coil pair is 0.769 ampere, and the turn numbers thereof are commonly selected to be 1.

* * * * *